(12) United States Patent
Xie et al.

(10) Patent No.: US 10,062,715 B2
(45) Date of Patent: Aug. 28, 2018

(54) TFT ARRAY SUBSTRATE AND MANUFACTURING METHOD THEREOF

(71) Applicant: Wuhan China Star Optoelectronics Technology Co., Ltd., Wuhan, Hubei (CN)

(72) Inventors: Lulu Xie, Guangdong (CN); Bin Xiong, Guangdong (CN); Yun Han, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 62 days.

(21) Appl. No.: 15/327,967

(22) PCT Filed: Oct. 10, 2016

(86) PCT No.: PCT/CN2016/101611
§ 371 (c)(1),
(2) Date: Jan. 20, 2017

(87) PCT Pub. No.: WO2018/045613
PCT Pub. Date: Mar. 15, 2018

(65) Prior Publication Data
US 2018/0211981 A1 Jul. 26, 2018

(30) Foreign Application Priority Data

Sep. 7, 2016 (CN) .......................... 2016 1 0807781

(51) Int. Cl.
*H01L 29/872* (2006.01)
*H01L 27/12* (2006.01)
*H05K 1/18* (2006.01)
*H01L 29/66* (2006.01)
*H01L 29/49* (2006.01)

(52) U.S. Cl.
CPC ...... *H01L 27/1237* (2013.01); *H01L 27/1259* (2013.01); *H01L 29/4908* (2013.01); *H01L 29/66143* (2013.01); *H05K 1/189* (2013.01)

(58) Field of Classification Search
CPC .. H01L 29/872; H01L 29/66143; H01L 29/47
See application file for complete search history.

(56) References Cited

U.S. PATENT DOCUMENTS 8,198,146 B2 * 6/2012 Ohnuma ........... H01L 21/76254
257/59

* cited by examiner

*Primary Examiner* — Quoc Hoang
(74) *Attorney, Agent, or Firm* — Andrew C. Cheng

(57) ABSTRACT

A TFT array substrate and its manufacturing method are disclosed. The TFT array substrate includes a substrate having a display area and a non-display area, and at least a Schottky diode on the non-display area. The Schottky diode includes an anode layer and a cathode layer on the substrate, a gate insulation layer on the substrate covering the anode and cathode layers, a first gate on the gate insulation layer covering portions of the anode and cathode layers, an inter-layer insulation layer on the gate insulation layer covering the first gate and having a number of vias exposing the anode and cathode layers, respectively, and a first electrode and a second electrode in the vias on the inter-layer insulation layer connecting the anode and cathode layers, respectively. The present disclosure achieves simplified manufacturing process and reduced cost by forming the Schottky diode simultaneously when the TFT is formed.

10 Claims, 4 Drawing Sheets

TFT ARRAY SUBSTRATE AND MANUFACTURING METHOD THEREOF

BACKGROUND OF THE INVENTION

1. Field of the Invention

The present disclosure relates to wafer manufacturing and flat panel display technologies, and in particular to a thin film transistor (TFT) array substrate and its manufacturing method.

2. The Related Arts

The display industry currently heavily relies on modularization. As shown in FIGS. 1 and 3, a liquid crystal panel module includes a liquid crystal panel, driver integrated circuit (DIC), and flexible printed circuit assembly (FPCA). The FPCA is for connecting the liquid crystal panel module to, for example, a mobile phone main board so that driving signals from the mobile phone main board's application processor (AP), video display data, and power voltage are delivered to the DIC which conducts complicated processing and conversion and outputs various analog voltages to the liquid crystal panel. The liquid crystal panel is therefore able to provide various visual presentations to the user. On the FPCA, there are some passive elements such as resistors, capacitors, Schottky diodes, etc. A circuit diagram is shown in FIG. 2.

Schottky diodes are required on FPCA so as to prevent the latch up between VGL (the voltage provide by DIC to control the on/off of thin film transistors (TFTs), and AVEE (or VSN, the working voltage provided to the DIC). However, the diodes placed on FPCA take up space, making FPCA larger. The diodes' height also have adversary effect to the thinning of the FPCA and the mobile phone.

SUMMARY OF THE INVENTION

To obviate the shortcomings of the prior art, the present disclosure teaches a novel thin film transistor (TFT) array substrate and a related manufacturing method so that the flexible printed circuit assembly (FPCA) may be reduced both in thickness and cost.

The TFT array substrate includes a substrate having a display area and a non-display area, and at least a Schottky diode on the non-display area. The Schottky diode includes an anode layer and a cathode layer on the substrate, a gate insulation layer on the substrate covering the anode and cathode layers, a first gate on the gate insulation layer covering portions of the anode and cathode layers, an inter-layer insulation layer on the gate insulation layer covering the first gate and having a number of vias exposing the anode and cathode layers, respectively, and a first electrode and a second electrode in the vias on the inter-layer insulation layer connecting the anode and cathode layers, respectively.

The TFT array substrate further includes at least a TFT on the display area of the substrate. The TFT includes an active layer on the substrate, and a source and a drain electrically connected to the active layer.

In one embodiment, the anode layer, the cathode layer, and the active layer are on a same layer.

In one embodiment, the first and second gates are on a same layer.

In one embodiment, the first and second electrodes, and the source and the drain are on a same layer.

In one embodiment, the active layer includes a source area, a drain area, and a ditch area between the source and drain areas. The anode layer, the source area, and the drain area are made of a same material, and the cathode layer and the ditch area are made of a same material.

In one embodiment, the TFT array substrate further include at least a soldering pad on the non-display area.

The method for manufacturing TFT array substrate includes the steps of: forming an active layer of a TFT on a display area of a substrate, and an anode layer and a cathode layer of a Schottky diode on a non-display area of the substrate; forming a gate insulation layer on the substrate covering the active layer, the anode layer, and the cathode layer; forming a second gate of the TFT and a first gate of the Schottky diode on the gate insulation layer, the second gate being right above the active layer, the first gate covering a portion of the anode layer and a portion of the cathode layer; forming an inter-layer insulation layer on the gate insulation layer covering the first and second gates; forming a number of vias in the inter-layer insulation layer and the gate insulation layer exposing the active layer, the anode layer, and the cathode layer, respectively; and forming a source and a drain of the TFT, and a first electrode and a second electrode of the Schottky diode on the inter-layer insulation layer in the vias connecting the active layer, the anode layer, and the cathode layer, respectively.

In one embodiment, the active layer includes a source area, a drain area, and a ditch area between the source and drain areas. The anode layer, the source area, and the drain area are made of a same material, and the cathode layer and the ditch area are made of a same material.

In one embodiment, the first and second gates are formed using a same technique.

According to the present disclosure, the material and placement cost for the TFT array substrate may be reduced. In addition, FPCA's area and thickness may be effectively lowered, thereby supporting the thinning of the liquid crystal module and the mobile phone as well. In addition, the TFT and the Schottky diode are formed simultaneously without an extra step, thereby simplifying the manufacturing process.

BRIEF DESCRIPTION OF THE DRAWINGS

To make the technical solution of the embodiments according to the present disclosure, a brief description of the drawings that are necessary for the illustration of the embodiments will be given as follows. Apparently, the drawings described below show only example embodiments of the present disclosure and for those having ordinary skills in the art, other drawings may be easily obtained from these drawings without paying any creative effort. In the drawings.

DETAILED DESCRIPTION OF THE PREFERRED EMBODIMENTS

In the following embodiments of the present disclosure are explained in details along with the accompanied drawings.

The drawings only depicts the embodiments schematically and do not limit the present disclosure in any way. For persons skilled in the art, it should be understood that there may be various variations without departing from the scope of the present disclosure.

Figure 1:
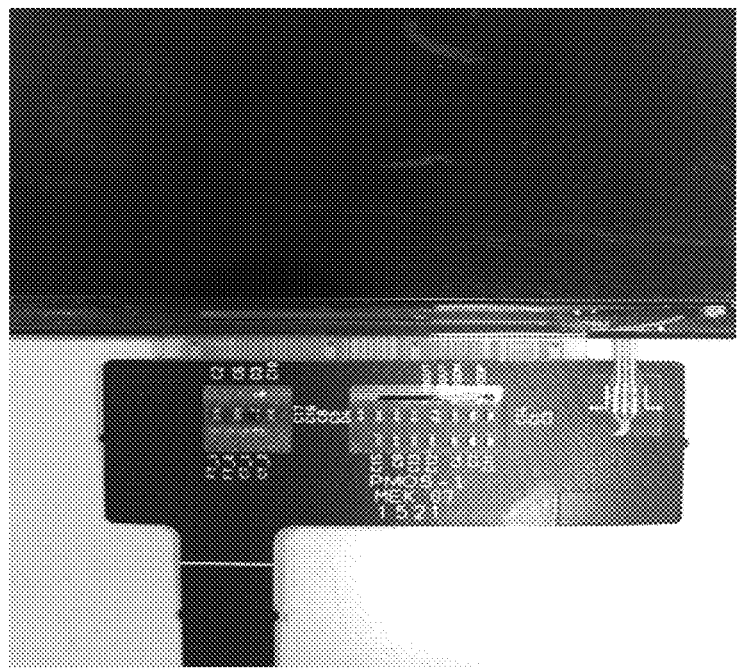
FIG. 1 shows a conventional liquid crystal module including Schottky diodes.
Figure 2:
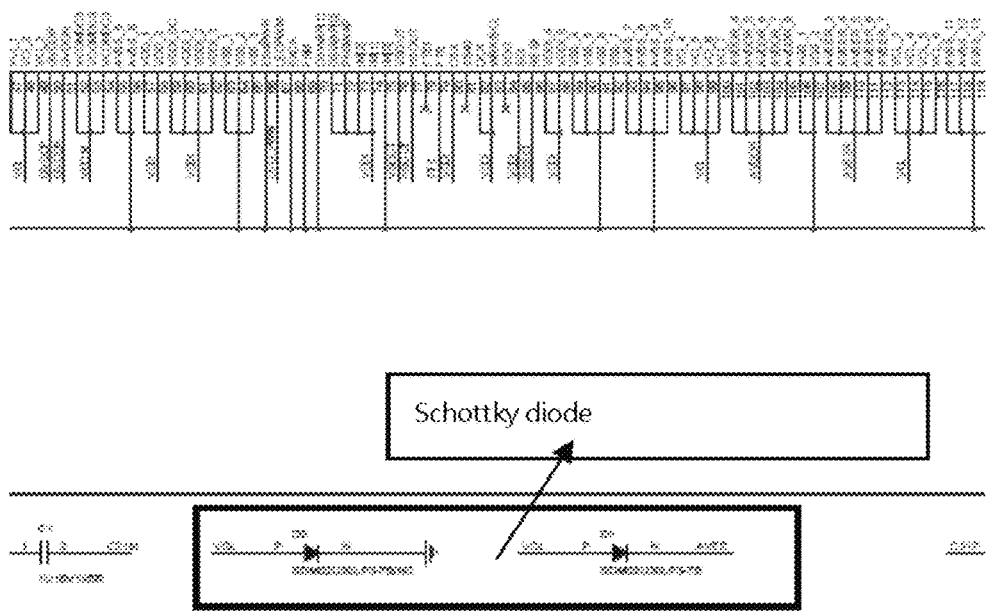
FIG. 2 is a schematic diagram showing a conventional flexible printed circuit assembly (FPCA)
Figure 3:
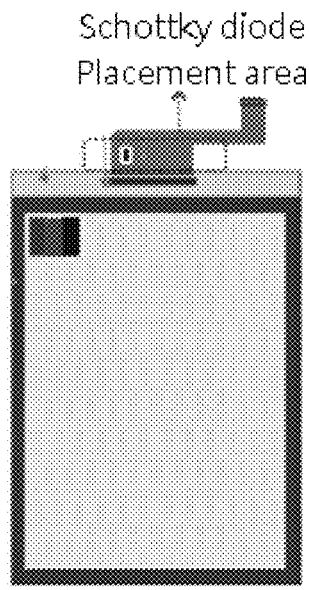
FIG. 3 shows the placement of a conventional Schottky diode on FPCA.
Figure 4:
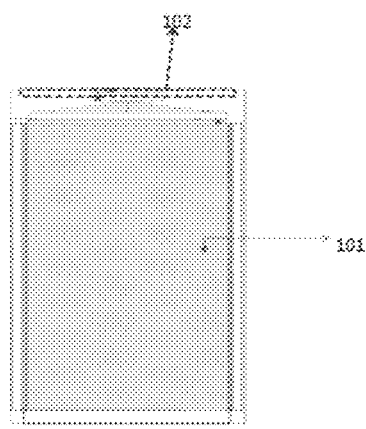
FIG. 4 is a schematic diagram showing a thin film transistor (TFT) array substrate according to an embodiment of the present disclosure.

FIG. 4 is a schematic diagram showing a thin film transistor (TFT) array substrate according to an embodiment of the present disclosure. FIGS. 5 to 11 depict the steps of a manufacturing method of the TFT array substrate of FIG. 4 according to an embodiment of the present disclosure.

Figure 5:
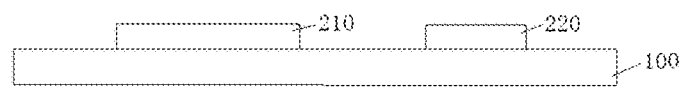
FIGS. 5 to 11 depict the steps of a manufacturing method of the TFT array substrate of FIG. 4 according to an embodiment of the present disclosure.

As shown in FIGS. 4 and 5, a first semiconductor 210 and a second semiconductor 220 separated from the first semiconductor 210 are formed on a substrate 100. The first semiconductor 210 is formed on a display area 101 of the substrate 100 whereas the second semiconductor 220 is formed on a non-display area 102 of the substrate 100 surrounding the display area 101. The substrate 100 may be made of a transparent glass material having $SiO_2$ as the main element but is not limited as such.

The first and second semiconductors 210 and 220 are usually formed using a physical vapor deposition (PVD) method. In one embodiment, the first and second semiconductors 210 and 220 are made of a same material.

An optional buffer layer (not shown) may be formed between the first and second semiconductors 210 and 220, and the substrate 100.

Figure 6:
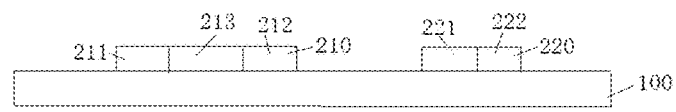

Then, as shown in FIG. 6, the first and second semiconductors 210 and 220 are doped to form a source area 211, a drain area 212, and a ditch area 213 between the source and drain areas 211 and 212 of an active layer of a TFT, and a anode layer 221 and a cathode layer 222 of a Schottky diode. A same dopant may be used to dope the first and second semiconductor 210 and 220. Therefore, the source and drain areas 211 and 212, and the anode layer 221 would be identical, and the ditch area 213 and the cathode layer 222 would be identical. Also a same doping technique may be used to dope the first and second semiconductors 210 and 220. As described, the Schottky diode and the TFT are formed together without additional process, and the manufacturing of the array substrate is simplified.

Figure 7:
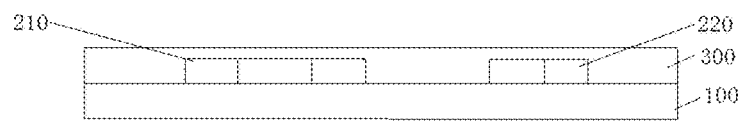

Then, as shown in FIG. 7, a gate insulation layer 300 is formed on the substrate 100 and covers the first and second semiconductors 210 and 220.

Figure 8:
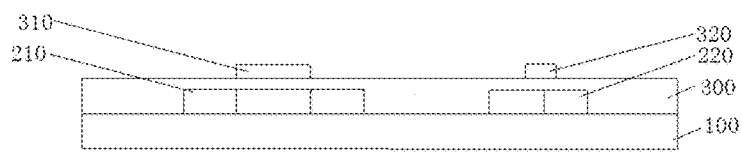

Then, as shown in FIG. 8, a second gate 310 of the TFT and a first gate 320 of the Schottky diode are formed on the gate insulation layer 300. The second gate 310 is right above the ditch area 213. The first gate 320 covers portions of the anode layer 221 and the cathode layer 222. In the present embodiment, a same technique may be used to form the second and first gates 310 and 320.

Figure 9:
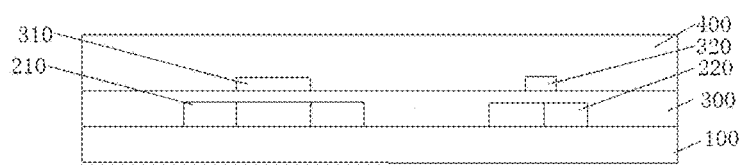
Figure 10:
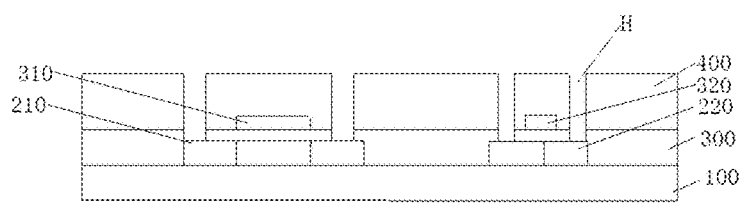

Then, as shown in FIG. 9, an inter-layer insulation layer 400 is formed on the gate insulation layer 300 and covers the second and first gates 310 and 320. Then, as shown in FIG. 10, vias H exposing the source area 211, the drain area 212, and the anode layer 221 are formed in the gate insulation layer 300 and the inter-layer insulation layer 400.

Figure 11:
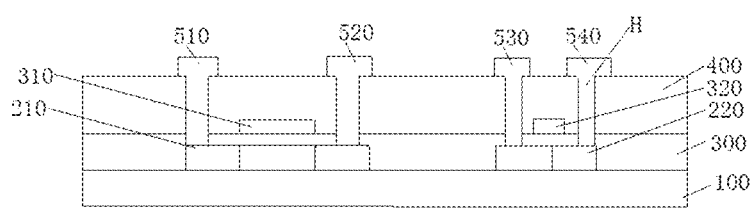

Finally, as shown in FIG. 11, the TFT's source 510 and drain 520, and the Schottky diode's first electrode 530 (for connecting external voltage such as VGL) and second electrode 540 (for connecting external voltage such as AVEE) are formed on the inter-layer insulation layer 400 in the vias H so that they are connected to the source area 211, the drain area 212, the anode layer 211, and the cathode layer 222, respectively. Optionally, at least a soldering pad (not show) may be formed on the non-display area 102 of the substrate 100.

As described, the present disclosure achieves simplified manufacturing process and reduced cost by forming the Schottky diode simultaneously when the TFT is formed.

In addition, the TFT array substrate and the manufacturing method may reduce the area and significantly lower the thickness of flexible printed circuit assembly (FPCA), thereby effectively supporting the miniaturization of liquid crystal modules and also the mobile phones.

Embodiments of the present disclosure have been described, but not intending to impose any unduly constraint to the appended claims. Any modification of equivalent structure or equivalent process made according to the disclosure and drawings of the present disclosure, or any application thereof, directly or indirectly, to other related fields of technique, is considered encompassed in the scope of protection defined by the claims of the present disclosure.

What is claimed is:

1. A thin film transistor (TFT) array substrate, comprising:
   a substrate having a display area and a non-display area surrounding the display area; and
   at least a Schottky diode on the non-display area of the substrate;
   wherein the Schottky diode comprises
   an anode layer and a cathode layer on the substrate;
   a gate insulation layer on the substrate covering the anode and cathode layers;
   a first gate on the gate insulation layer covering a portion of the anode layer and a portion of the cathode layer;
   an inter-layer insulation layer on the gate insulation layer covering the first gate, the inter-layer insulation layer having a plurality of vias exposing the anode and cathode layers, respectively; and
   a first electrode and a second electrode in the vias on the inter-layer insulation layer connecting the anode and cathode layers, respectively.

2. The TFT array substrate as claimed in claim 1, further comprising
   at least a TFT on the display area of the substrate;
   wherein the TFT comprises
   an active layer on the substrate; and
   a source and a drain electrically connected to the active layer.

3. The TFT array substrate as claimed in claim 2, wherein the anode layer, the cathode layer, and the active layer are on a same layer.

4. The TFT array substrate as claimed in claim 2, wherein the first and second gates are on a same layer.

5. The TFT array substrate as claimed in claim 2, wherein the first and second electrodes, and the source and the drain are on a same layer.

6. The TFT array substrate as claimed in claim 2, wherein the active layer comprises a source area, a drain area, and a ditch area between the source and drain areas; the anode layer, the source area, and the drain area are made of a same material; and the cathode layer and the ditch area are made of a same material.

7. The TFT array substrate as claimed in claim 2, further comprising at least a soldering pad on the non-display area.

8. A method for manufacturing TFT array substrate, comprising:

forming an active layer of a TFT on a display area of a substrate, and an anode layer and a cathode layer of a Schottky diode on a non-display area of the substrate;

forming a gate insulation layer on the substrate covering the active layer, the anode layer, and the cathode layer;

forming a second gate of the TFT and a first gate of the Schottky diode on the gate insulation layer, the second gate being right above the active layer, the first gate covering a portion of the anode layer and a portion of the cathode layer;

forming an inter-layer insulation layer on the gate insulation layer covering the first and second gates;

forming a plurality of vias in the inter-layer insulation layer and the gate insulation layer exposing the active layer, the anode layer, and the cathode layer, respectively; and forming a source and a drain of the TFT, and a first electrode and a second electrode of the Schottky diode on the inter-layer insulation layer in the vias connecting the active layer, the anode layer, and the cathode layer, respectively.

9. The method as claimed in claim 8, wherein the active layer comprises a source area, a drain area, and a ditch area between the source and drain areas; the anode layer, the source area, and the drain area are made of a same material; and the cathode layer and the ditch area are made of a same material.

10. The method as claimed in claim 8, wherein the first and second gates are formed using a same technique.

* * * * *